United States Patent
Tanaka (10) Patent No.: US 8,785,334 B2
(45) Date of Patent: Jul. 22, 2014

(54) SELECT TRANSISTOR, METHOD FOR MAKING SELECT TRANSISTOR, MEMORY DEVICE, AND METHOD FOR MANUFACTURING MEMORY DEVICE

(75) Inventor: Yoshitsugu Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 136 days.

(21) Appl. No.: 13/478,573

(22) Filed: May 23, 2012

(65) Prior Publication Data

US 2012/0299085 A1    Nov. 29, 2012

(30) Foreign Application Priority Data

May 27, 2011    (JP) .................................. 2011-119591

(51) Int. Cl.
*H01L 21/00* (2006.01)

(52) U.S. Cl.
USPC ..... 438/783; 438/275; 438/308; 257/E21.423

(58) Field of Classification Search
USPC ......... 438/197, 201, 216, 275, 279, 287, 288, 438/308, 783, 795, 798; 257/E21.423
See application file for complete search history.

(56) References Cited

U.S. PATENT DOCUMENTS

| 7,646,630 | B2 | 1/2010 | Lowrey et al. | |
| 2010/0221905 | A1* | 9/2010 | Hautala et al. | 438/591 |
| 2012/0032251 | A1* | 2/2012 | Yaegashi | 257/324 |

FOREIGN PATENT DOCUMENTS

| JP | 2009-245958 A | 10/2009 |
| JP | 2010-123684 A | 6/2010 |

* cited by examiner

*Primary Examiner* — Eduardo A Rodela
(74) *Attorney, Agent, or Firm* — Nath Goldberg & Meyer; Jerald L. Meyer (57) ABSTRACT

A select transistor for use in a memory device including a plurality of memory transistors connected in series includes a tunnel insulating layer formed on a semiconductor substrate, a charge storage layer formed on the tunnel insulating layer, a blocking insulating layer formed on the charge storage layer and configured to be irradiated with a gas cluster ion beam containing argon as source gas, a gate electrode formed on the blocking insulating layer, and a source/drain region formed within the semiconductor substrate at both sides of the gate electrode.

2 Claims, 6 Drawing Sheets

SELECT TRANSISTOR, METHOD FOR MAKING SELECT TRANSISTOR, MEMORY DEVICE, AND METHOD FOR MANUFACTURING MEMORY DEVICE

CROSS-REFERENCE TO RELATED APPLICATION

This application claims the priority to Japanese Patent Application No. 2011-119591, filed on May 27, 2011, in the Japan Patent Office, the disclosure of which is incorporated herein in its entirety by reference.

TECHNICAL FIELD

The present disclosure relates to a select transistor, a method for making the select transistor, a memory device, and a method for manufacturing the memory device.

BACKGROUND

A conventional memory device, such as an NAND flash memory, includes a plurality of memory cell transistors (hereinafter memory transistors) connected in series, and selects transistors disposed at both ends of the plurality of memory transistors connected in series to improve integration density. Since the memory transistor stores information based on the presence of storages of charge, it is configured such that a tunnel insulating layer, a charge storage layer, a blocking insulating layer and a gate electrode are stacked in order. In contrast, since there is no need for the select transistor to store charge, no tunnel insulating layer and no charge storage layer are required. Accordingly, the select transistor is configured such that a gate insulating layer and a gate electrode are stacked in order.

In this manner, the memory transistor is different in structure from the select transistor. Because of such a difference in structure, conventional manufacturing processes include separate processes for forming a memory transistor and a select transistor. Since the memory transistor forming process and the select transistor forming process are separately performed, the number of manufacturing processes for memory devices is increased, thereby increasing turn around time (TAT).

To avoid this problem, there has been proposed a memory device manufacturing method in which a select transistor is configured such that a tunnel insulating layer, a blocking insulating layer and a gate electrode are stacked in order and a structure of a memory transistor is substantially equal to that of the select transistor.

In this proposed method, silicon (Si) is contained in an aluminum oxide ($Al_2O_3$) layer used as a blocking insulating layer in order to suppress a variation of a flat band voltage (Vfb) which results from charge trap at an interface between the tunnel insulating layer and the blocking insulating layer of the select transistor. Since the silicon is contained in the $Al_2O_3$ layer, the amount (or density) of charges trapped at the interface between the tunnel insulating layer and the blocking insulating layer may be decreased to suppress shift (variation) of Vfb.

However, in the above proposed method, it is impossible to completely prevent such a variation of Vfb due to the charge trap although it may decrease the shift of Vfb. In addition, since the structure of the memory transistor is not completely equal to that of the select transistor, it requires an additional process of removing the charge storage layer from a region where the select transistor is formed after forming the tunnel insulating layer and the charge storage layer on a semiconductor substrate.

SUMMARY

The present disclosure provides a select transistor which is manufactured with the less number of processes and can suppress a shift of a flat band voltage, a method for making the select transistor, a memory device including the select transistor and a method for manufacturing the memory device.

According to one embodiment of the present disclosure, there is provided a select transistor for use in a memory device including a plurality of memory transistors connected in series including a tunnel insulating layer formed on a semiconductor substrate, a charge storage layer formed on the tunnel insulating layer, a blocking insulating layer formed on the charge storage layer and configured to be irradiated with a gas cluster ion beam containing argon as source gas, a gate electrode formed on the blocking insulating layer, and a source/drain region formed within the semiconductor substrate at both sides of the gate electrode.

According to another embodiment of the present disclosure, there is provided a method for making a select transistor for use in a memory device including a plurality of memory transistors connected in series including forming a tunnel insulating layer on a semiconductor substrate, forming a charge storage layer on the tunnel insulating layer; forming a blocking insulating layer on the charge storage layer, irradiating the blocking insulating layer with a gas cluster ion beam containing argon as source gas, forming a gate electrode on the blocking insulating layer, and forming a source/drain region within the semiconductor substrate at both sides of the gate electrode.

According to another embodiment of the present disclosure, there is provided a memory device including a plurality of memory transistors connected in series and select transistors disposed in both ends of the plurality of memory transistors, wherein each of the memory transistors and each of the select transistors including a tunnel insulating layer formed on a semiconductor substrate, a charge storage layer formed on the tunnel insulating layer, a blocking insulating layer formed on the charge storage layer, a gate electrode formed on the blocking insulating layer, and a source/drain region formed within the semiconductor substrate at both sides of the gate electrode, and wherein the blocking insulating layer included in the select transistor is irradiated with a gas cluster ion beam containing argon as source gas.

According to another embodiment of the present disclosure, there is provided a method for manufacturing a memory device including a plurality of memory transistors connected in series and select transistors disposed in both ends of the plurality of memory transistors, including forming a tunnel insulating layer on a semiconductor substrate; forming a charge storage layer on the tunnel insulating layer, forming a blocking insulating layer on the charge storage layer, selectively irradiating the blocking insulating layer in a region where the select transistor is to be formed, with a gas cluster ion beam containing argon as source gas, forming a gate electrode on the blocking insulating layer, patterning the tunnel insulating layer, the charge storage layer, blocking insulating layer and the gate electrode, and forming a source/drain region within the semiconductor substrate at both sides of the patterned gate electrode.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspects of this disclosure may be practiced without these specific details. In other instances, well-known methods, procedures, systems, and components have not been described in detail so as not to unnecessarily obscure aspects of the various embodiments.

Figure 1:
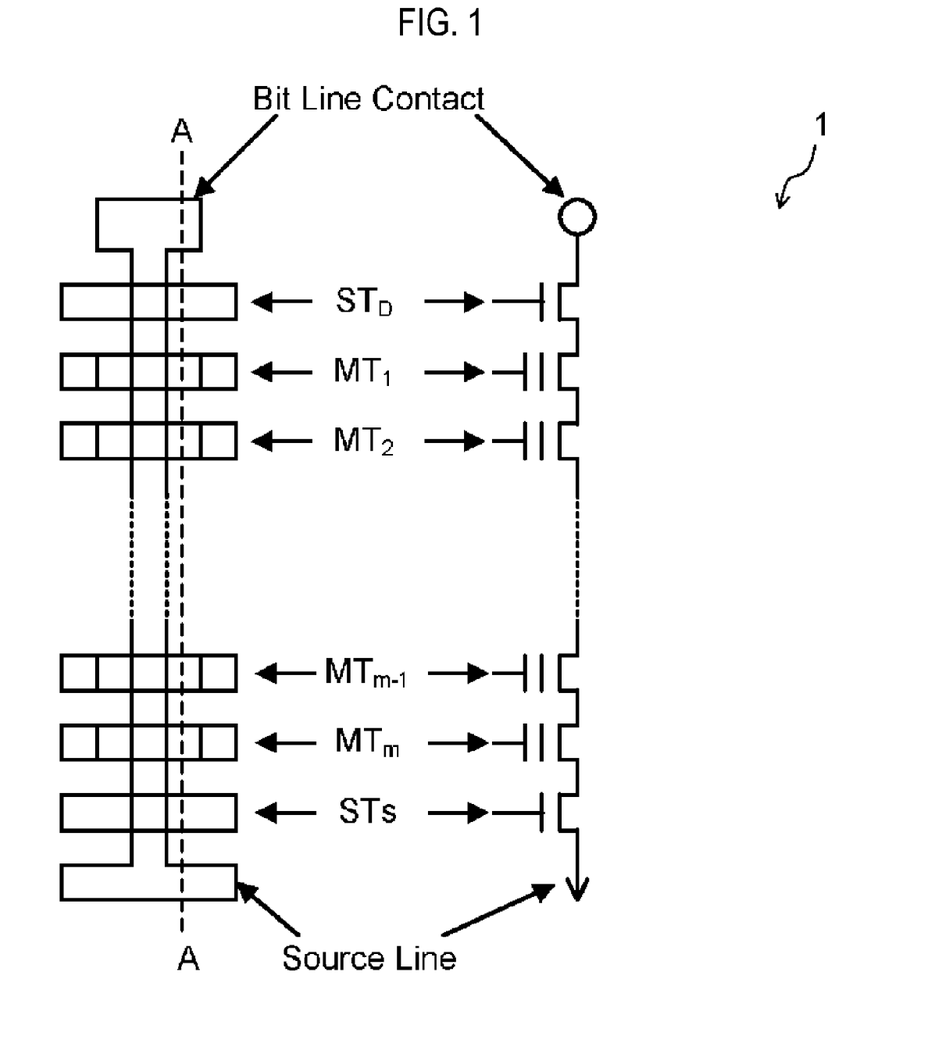
FIG. 1 is a circuit diagram of a memory device according to an embodiment of the present disclosure.
Figure 2:
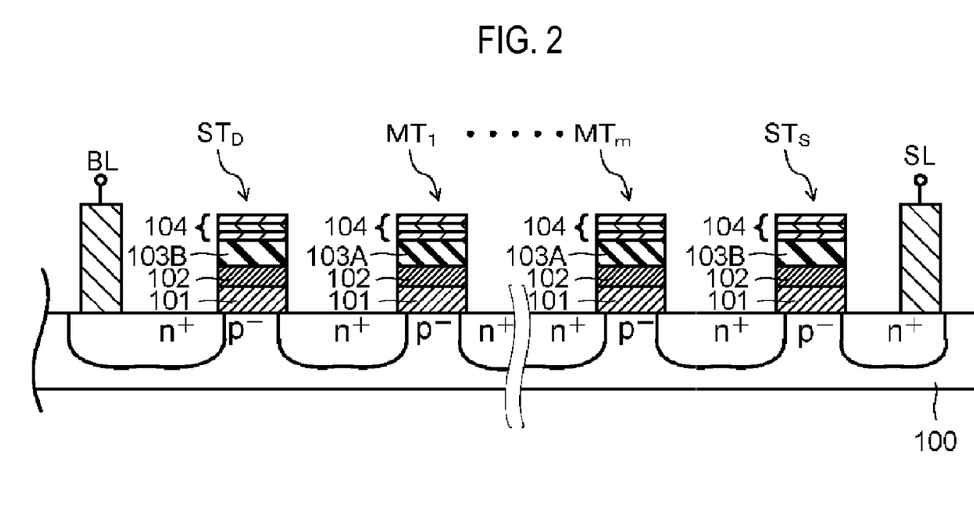
FIG. 2 is a sectional view of the memory device shown in FIG. 1.

FIG. 1 illustrates a general configuration and equivalent circuit of a memory device 1 according to an embodiment of this disclosure. FIG. 2 is a sectional view taken along line A-A in FIG. 1. The configuration of the memory device 1 according to some embodiments will be described below with reference to FIGS. 1 and 2. In FIG. 1, the memory device 1 will be illustrated as a MONOS type NAND flash memory.

The memory device 1 includes memory transistors $MT_1$ to $MT_m$ and select transistors $ST_D$ and $ST_S$ formed on a semiconductor substrate 100. The memory transistors $MT_1$ to $MT_m$ are connected in series. The select transistors $ST_D$ and $ST_S$ are respectively formed in both ends of the memory transistors $MT_1$ to $MT_m$, which are connected in series. Here, m represents 2n, and n typically takes a value of 4 or 5.

The memory transistor $MT_1$ to $MT_m$ has a structure where a tunnel insulating layer 101, a charge storage layer 102, a blocking insulating layer 103A and a gate electrode 104 are stacked on top of each other in order. The select transistor $ST_D$ and $ST_S$ has a structure where the tunnel insulating layer 101, the charge storage layer 102, a blocking insulating layer 103B and the gate electrode 104 are stacked on top of each other in order.

As such, the memory transistor $MT_1$ to $MT_m$ has generally the same structure as the select transistor $ST_D$ and $ST_S$. However, the blocking insulating layer 103B of the select transistors $ST_D$ and $ST_S$ is different from the blocking insulating layer 103A of the memory transistor $MT_1$ to $MT_m$, in that blocking insulating layer 103B is modified by being irradiated with a gas cluster ion beam (GCIB) containing argon (Ar) as source gas.

In this embodiment, the tunnel insulating layer 101, the charge storage layer 102 and the blocking insulating layers 103A and 103B are respectively formed of a silicon oxide ($SiO_2$) layer, a silicon nitride ($Si_3N_4$) layer and an aluminum oxide ($Al_2O_3$) layer. The gate electrode 104 has a structure in which a titanium nitride (TiN) layer, a tungsten (W) layer, a titanium nitride (TiN) layer are stacked on top of each other in order.

FIGS. 3A to 3I illustrate a procedure of a method for manufacturing the memory device 1 shown in FIG. 1. The method for manufacturing the memory device 1 shown in FIG. 1 will be described below with reference to FIGS. 3A to 3I.

Figure 3A:
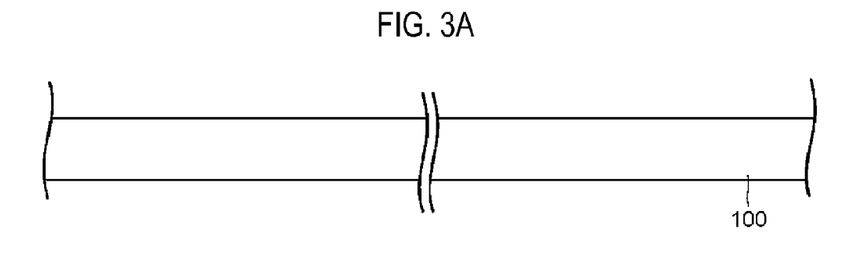
FIGS. 3A to 3C illustrate a procedure of a method for manufacturing the memory device shown in FIG. 1.

First, an element isolation region formed of a $SiO_2$ layer is formed on the semiconductor substrate 100, as shown in FIG. 3A. The element isolation region may be formed by a known method. The known method can be, for example, a local oxidation of silicon (LOCOS) method for forming a $SiO_2$ layer between elements by selectively oxidizing the semiconductor substrate using a $Si_3N_4$ layer as a mask. Further, the known method can include a shallow trench isolation (STI) method of forming a shallow groove in an isolation region on the semiconductor substrate using dry etching, depositing a $SiO_2$ layer using chemical vapor deposition (CVD), and removing the $SiO_2$ layer deposited in portions except the groove using chemical mechanical polishing (CMP), and so on. The element isolation region is not shown in FIG. 3A.

Figure 3B:
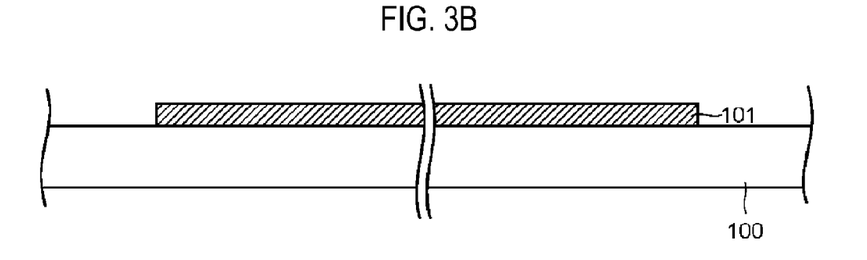

Next, a $SiO_2$ layer is formed, as tunnel insulating layer 101, on the semiconductor substrate 100 on which the element isolation region is formed, as shown in FIG. 3B). The $SiO_2$ layer may be formed by thermally oxidizing the semiconductor substrate 100 or depositing $SiO_2$ using CVD.

Figure 3C:
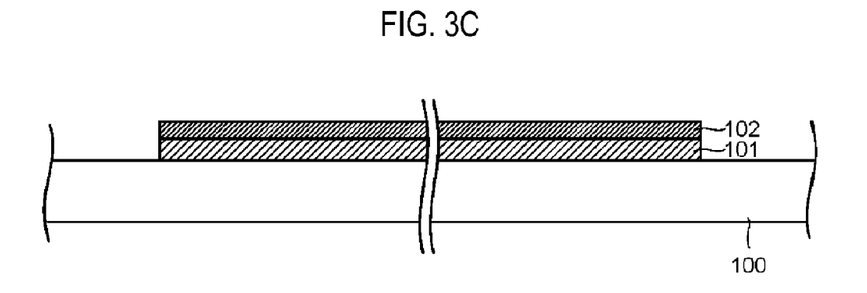

Further, a $Si_3N_4$ layer is formed, as the charge storage layer 102, on the $SiO_2$ layer as shown in FIG. 3C. The $Si_3N_4$ layer is formed by depositing $Si_3N_4$ using CVD.

Figure 3D:
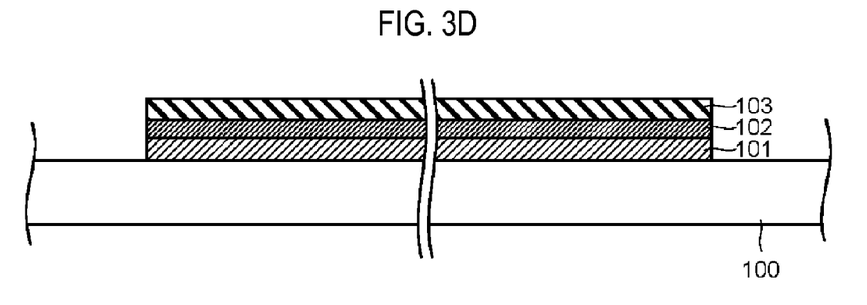
FIGS. 3D to 3F illustrate a procedure of a method for manufacturing the memory device shown in FIG. 1.

Thereafter, an $Al_2O_3$ layer is formed, as the blocking insulating layer 103A, on the $Si_3N_4$ layer shown in FIG. 3D. The $Al_2O_3$ layer is formed by depositing $Al_2O_3$ using atomic layer deposition (ALD), molecular beam epitaxy (MBE) or the like. However, methods including physical vapor deposition (PVD) and CVD may not be used.

Figure 3E:
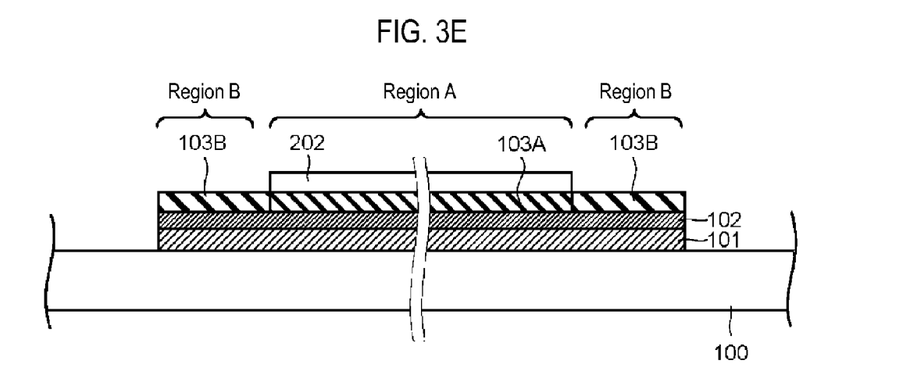

The $Al_2O_3$ layer formed in a region B, where the select transistors $ST_D$ and $ST_S$ are to be formed, is selectively irradiated with GCIB containing argon (Ar) as source gas as shown in FIG. 3E. More specifically, a photoresist 202 is applied on the formed $Al_2O_3$ layer and the photoresist 202 is then pre-baked an exposed. If a positive photoresist is used, only the region B where the select transistors $ST_D$ and $ST_S$ are to be formed is exposed to light because only a portion exposed to light would be dissolved. If a negative photoresist is used, a region A where the memory transistors $MT_1$ to $MT_m$ are to be formed is exposed to light because the unexposed portion of the photoresist is dissolved. After the exposure, the photoresist 202 is developed to remove the photoresist of the region B where the select transistors $ST_D$ and $ST_S$ are to be formed. A spin-coating or spraying can be used for applying the photoresist 202, and a stepper or a scanner can be used for the exposure.

Next, irradiation of GCIB containing argon (Ar) as source gas is carried out. The $Al_2O_3$ layer formed in the region B where the select transistors $ST_D$ and STS are to be formed is selectively irradiated with GCIB containing argon (Ar) as source gas using the photoresist 202 as a mask. When GCIB is used, since the $Al_2O_3$ layer is irradiated with a cluster of several to thousands of Ar atoms, a penetration distance in the depth direction is short. Since the thickness of the photoresist 202 is typically several hundred nanometers, the irradiation of the $Al_2O_3$ layer in a region having the photoresist 202, which corresponds to the region A where the memory transistors $MT_1$ to $MT_m$ are to be formed, with GCIB containing argon (Ar) as source gas has no problem. In FIG. 3E, the Al$_2$O$_3$ layer in the region B where the select transistors ST$_D$ and STS are to be formed is modified into the blocking insulating layer 103B.

Figure 3F:
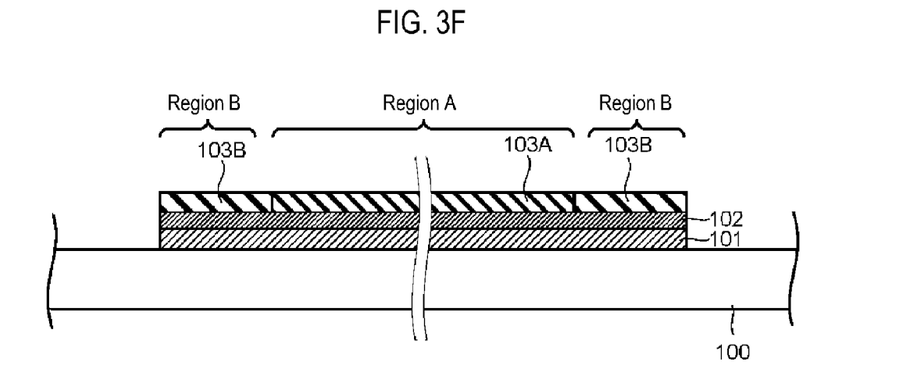

Next, the photoresist 202 is removed, as shown in FIG. 3F. The photoresist 202 is typically removed by a dry process using an asher, but may be removed by a wet process.

Figure 3G:
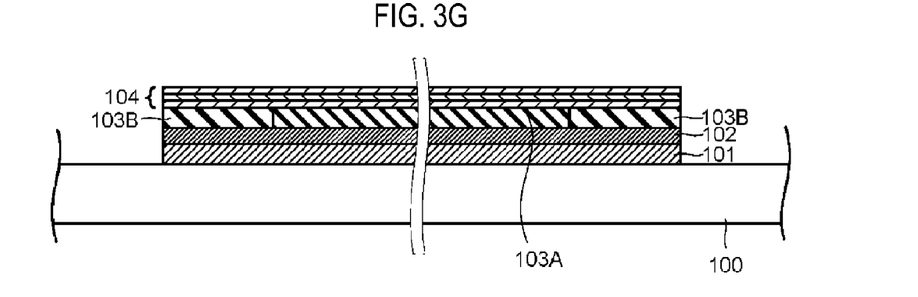
FIGS. 3G to 3I illustrate a procedure of a method for manufacturing the memory device shown in FIG. 1.

After the photoresist 202 is removed, as the gate electrode 104, a TiN layer, a W layer and a TiN layer are stacked in order on the Al$_2$O$_3$ layer, as shown in FIG. 3G. The TiN layer and the W layer are formed by ALD, MBE or the like besides PVD and CVD.

Figure 3H:
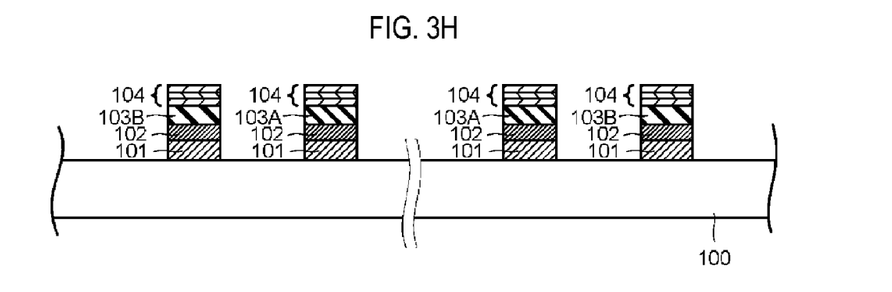

After the TiN layer, the W layer and the TiN layer are stacked to form the gate electrode 104, the layers stacked in FIGS. 3A to 3G are patterned into a desired structure using a known lithographic and etching technique, as shown in FIG. 3H.

Figure 3I:
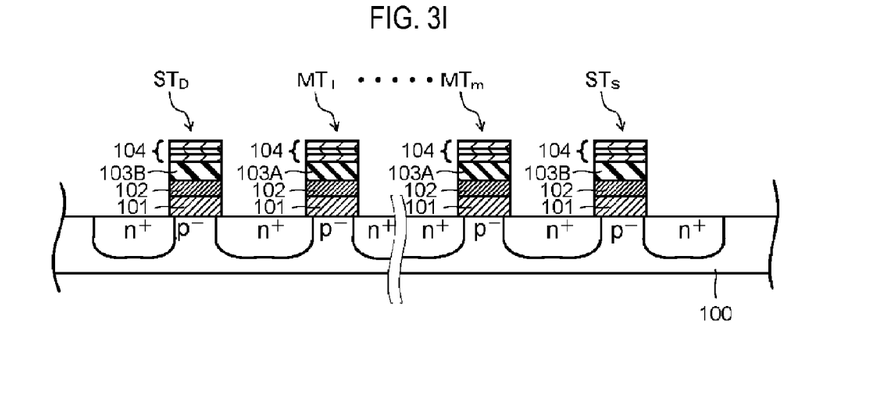

After the patterning, the semiconductor substrate 100 is ion-implanted with n type dopants such as arsenic (As) or the like (in case where the semiconductor substrate 100 is of a p type) or p type dopants such as boron (B) or the like (in case where the semiconductor substrate 100 is of an n type). Further, the semiconductor substrate 100 is then subjected to heat treatment. Thereafter, source/drain regions are formed in both sides of the memory transistors MT$_1$ to MT$_m$ and the select transistors ST$_D$ and ST$_S$, as shown in FIG. 3I. In addition, wirings or the like are formed in a known manner, thereby completing the memory device 1 of this embodiment.

The tunnel insulating layer 101 may be formed of high dielectric constant films such as silicon oxynitride (SiON), Al$_2$O$_3$, hafnium oxide (HfO$_2$), zirconium oxide (ZrO$_2$), tantalum oxide (Ta$_2$O$_5$), yttrium oxide (Y$_2$O$_3$) or the like, in addition to SiO$_2$. The charge storage layer 102 may be formed of high dielectric constant films such as Al$_2$O$_3$, HfO$_2$, ZrO$_2$, Ta$_2$O$_5$, Y$_2$O$_3$ or the like, in addition to Si$_3$N$_4$. The gate electrode may be formed of a single layer such as a polysilicon (poly-Si) film, tantalum nitride (TaN) film, metal (W, Pt or the like) film or a multi-layered structure thereof in addition to TiN/W/TiN structure.

Next, preparation procedure and evaluation will be described.

Similar to FIGS. 3A to 3C, a SiO$_2$ layer having height of 4 nm, a Si$_3$N$_4$ layer having height of 7 nm and an Al$_2$O$_3$ layer having height of 15 nm were formed on a P type semiconductor substrate.

Similar to FIGS. 3D to 3F, the Al$_2$O$_3$ layer in a region where select transistors ST$_D$ and ST$_S$ are to be formed was irradiated with GCIB containing argon (Ar) as source gas, with an acceleration voltage of about 3 kV and with a dose of Ar of 1E14 [atoms/cm$^2$].

Next, Similar to FIGS. 3G to 3I, as a gate electrode, a TiN layer, a W layer and a TiN layer were stacked and patterned on the Al$_2$O$_3$ layer. After the patterning, the semiconductor substrate 100 was ion-implanted with arsenic (As) and then was subjected to heat treatment. Then source/drain regions are formed in both sides of the memory transistors MT$_1$ to MT$_m$ and the select transistors ST$_D$ and ST$_S$, respectively. Finally, wirings or the like were formed in the gate electrode and the source/drain regions, thereby completing the memory device 1.

According to another embodiment, all configurations stay the same as above except that the Al$_2$O$_3$ layer in the region where the select transistors ST$_D$ and ST$_S$ are to be formed is irradiated with GCIB containing oxygen (O) as source gas and the semiconductor substrate 100 is doped with oxygen (O).

According to another embodiment, all configurations stay the same as above except that the Al$_2$O$_3$ layer in the region where the select transistors ST$_D$ and ST$_S$ are to be formed is ion-implanted with Ar ions without using GCIB.

According to another embodiment, all configurations stay the same as above except that the Al$_2$O$_3$ layer in the region where the select transistors ST$_D$ and ST$_S$ are to be formed is not doped to form a gate electrode.

Figure 4:
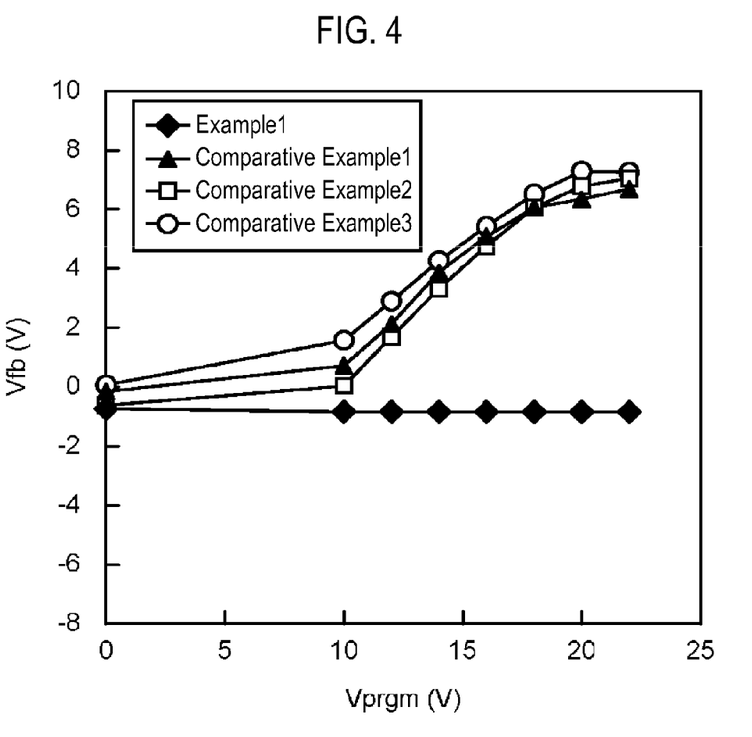
FIG. 4 illustrates a variation in a characteristic of a flat band voltage.

FIG. 4 is a view illustrating variations in flat band voltages (Vfb) of select transistors STD in the memory devices prepared some embodiments according to the present disclosure. In FIG. 4, vertical and horizontal axes represent a flat band voltage (Vfb) and a program voltage (Vprgm), respectively. It can be clearly seen from FIG. 4 that the flat band voltages Vfb of the select transistors of in any of the above embodiments increase with increase in the program voltage (Vprgm). On the other hand, it can be seen that that the flat band voltage Vfb of the select transistor of some of the above embodiments remains substantially constant at 0 with increase in the program voltage (Vprgm). It is believed that this is because the Al$_2$O$_3$ layer is modified by irradiation the layer with GCIB containing argon (Ar) as source gas.

As described above, the memory device of Example 1 can suppress a variation in a flat band voltage of a select transistor by irradiating a blocking insulating layer with GCIB containing argon (Ar) as source gas, so that a structure of a memory transistor can be substantially equal to that of a select transistor, which may result in prevention of increase in the number of memory device manufacturing processes and increase in turn around time (TAT).

According to the present disclosure in some embodiments, it is possible to provide a select transistor which is manufactured with the less number of processes and suppresses a shift of a flat band voltage, a method for making the select transistor, a memory device including the select transistor, and a method for manufacturing the memory device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. For example, although it has been illustrated in the above embodiments that a photoresist is used as a mask when the blocking insulating layer is doped with Ar, a film (a Si$_3$N$_4$ film, a SiO$_2$ film or the like) made of different material may be used as the mask. The accompanying claims and their equivalents are intended to cover such forms or modifications as would fall within the scope and spirit of the disclosures.

What is claimed is:

1. A method for manufacturing a memory device including a plurality of memory transistors connected in series and select transistors disposed in both ends of the plurality of memory transistors, comprising:

forming a tunnel insulating layer on a semiconductor substrate;

forming a charge storage layer on the tunnel insulating layer;

forming a blocking insulating layer on the charge storage layer;

selectively irradiating the blocking insulating layer in a region where the select transistor is to be formed, with a gas cluster ion beam containing argon as source gas;

forming a gate electrode on the blocking insulating layer;

patterning the tunnel insulating layer, the charge storage layer, blocking insulating layer and the gate electrode; and forming a source/drain region within the semiconductor substrate at both sides of the patterned gate electrode.

2. The method of claim 1, wherein the blocking insulating layer is made of aluminum oxide.

* * * * *